(12) United States Patent
Ju

(10) Patent No.: US 7,736,169 B1
(45) Date of Patent: Jun. 15, 2010

(54) CHIP MODULE SLIDING CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/382,154

(22) Filed: Mar. 10, 2009

(51) Int. Cl.
*H01R 13/627* (2006.01)

(52) U.S. Cl. .................................. 439/342; 439/259

(58) Field of Classification Search ............... 439/331, 439/342, 343, 529, 330, 73
See application file for complete search history.

(56) References Cited

U.S. PATENT DOCUMENTS

| | | | | |
|---|---|---|---|---|
| 5,454,727 A | * | 10/1995 | Hsu | 439/263 |
| 5,482,471 A | * | 1/1996 | Mori et al. | 439/263 |
| 5,569,045 A | * | 10/1996 | Hsu | 439/342 |
| 5,649,836 A | * | 7/1997 | Kashiwagi | 439/342 |
| 5,704,800 A | * | 1/1998 | Sato et al. | 439/342 |
| 7,635,277 B2 | * | 12/2009 | Kanesashi | 439/331 |

\* cited by examiner

*Primary Examiner*—Michael C Zarroli
(74) *Attorney, Agent, or Firm*—Rosenberg, Klein & Lee

(57) ABSTRACT

The electrical connector includes a body having a terminal-receiving area, at least one terminal disposed in the corresponding terminal-receiving area, a cover sliding along a sliding route and assembled on the body. The top surface of the cover has an insertion area with holes. When the cover slides to a position, the insertion area is corresponding to the terminal-receiving area for pins of a chip module passing through the insertion area and terminal-receiving area to electrically connect with the terminal. At least one receiving plane is disposed on the top of the cover for holding. The receiving plane is higher than the insertion area. The two opposite sides of the cover outside the insertion area have a lateral protrusion protruding upwards. The lateral protrusions are parallel to the sliding route of the cover.

22 Claims, 7 Drawing Sheets

CHIP MODULE SLIDING CONNECTOR

BACKGROUND OF THE INVENTION

1. Field of the Invention

The present invention relates to an electrical connector, in particular to an improved electrical connector with good electrical connection.

2. Description of Related Art

Please refer to FIG. 1 to FIG. 3, a traditional connector for electrically connected with a chip module (a) and a printed circuit board (not shown in the figure). The traditional connector usually includes a body (b), at least one terminal (not shown in the figure) disposed in the body (b), and a cover (c).

The chip module (a) has a loading plate (a1), a chip unit (not shown in the figure) disposed on the loading plate (a1), at least one pin (a2) disposed under the loading plate (a1) and electrically connected with the chip unit. The body (b) includes at least one terminal-receiving hole (b1) for receiving the corresponding terminal (not shown in the figure).

The cover (c) includes at least one through hole (c1) for inserting the pin (a2) of the chip module (a). A receiving plane (c2) for receiving the chip module (a) disposed on the up surface of the cover (c). A protruding portion (c3) for against the chip module (a) disposed in the center of the cover (c). A pressing portion (c4) with a height the same as the receiving plane (c2) and the protruding portion (c3) is disposed around the edge of the receiving plane (c2). The receiving plane (c2), the protruding portion (c3), and the pressing portion (c4) press against the loading plate (a1) of the chip module (a) together. The area of the loading plate (a1) is bigger or equal to the receiving plane (c2).

The cover (c) is pushed by a driving device (not shown in the figure) to make the cover (c) level move relative to the body (b). Therefore, the relative position of the body (b) and the cover (c) is changed to make the chip module (a) electrically connected with the printed circuit board (not shown in the figure).

In order to make sure the pin (a2) of the chip module (a) passes through the through hole (c1) of the cover (c) and is partially received in the terminal-receiving hole (b1) of the body (b), the thickness of the cover (c) must not be chosen too thick, and the height of the receiving plane (c2) of the cover (c), the protruding portion (c3) and the pressing portion (c4) must not be too high. Then the protruding portion (c3) and the pressing portion (c4) can only hold the chip module (a) but can not increase the strength of cover (c).

When the chip module (a) is assembled on the electrical connector, because the cover (c) is thin, its mechanical strength is low, when the pin (a2) of the chip module (a) is inserted into the through hole (c1) of the cover (c), the cover (c) can not assure a better flat. Therefore, it would lead the cover (c) easy to deform and influence the pin (a2) of the chip module (a) to insert in the through hole (c1) of the cover (c) to electrically connected with the terminal of the connector (not shown in the figure).

Besides, when the cover (c) is pushed by the driving device (not shown in the figure) to move relative to the body (b), the cover (c) is received a thrust along the movement direction of the cover (c) by the driving device and a resistance opposite to the movement direction of the cover (c) by the pin (a2). The two stresses (thrust and resistance) are at the two opposite sides of the cover (c) and parallel to the movement direction of the cover (c). Because the area of the loading plate (a1) of the chip module (a) is bigger or equal to the receiving plane (c2) of the cover (c), and the width of the two opposite sides of the cover (c) is limited, the two stresses are focused on the two opposite sides of the cover (c).

When the number of pin (a2) of chip module (a) increases, the resistance opposite to the movement direction of the cover (c) by the pin (a2) of the chip module (a) increases, the corresponding thrust will increase too. As a result, the stresses generated at the two opposite sides of the cover (c) are concentrated easily, the two stresses would lead the cover (c) to deform and bend. The pin (a2) of the chip module (a) cannot completely come into contact with the terminal (not shown in the figure) of the electrical connector. It will lead to electric contact failure and can not use normally. After the electrical connector is used for a long time, the cover (c) will become deformed or broken. Thus, the life of the electrical connector is shortened.

Therefore, it is necessary to design an improved electrical connector to overcome the above-mentioned problems.

SUMMARY OF THE INVENTION

The primary object of the present invention is to provide an improved electrical connector with a good electrical connection.

In order to achieve the above object, the present invention provides an electrical connector for holding a chip module. The chip module has a loading plate. The loading plate has a chip unit thereon and at least one pin under the loading plate electrically connected with the chip unit. The electrical connector includes a body. A terminal-receiving area disposed in the body. At least one terminal is disposed in the corresponding terminal-receiving area. A cover slidably disposed on the body along a sliding route, an insertion area with holes therein is disposed on the top surface of the cover. When the cover slides along a sliding route to a defining position, the insertion area is corresponding to the terminal-receiving area, for the pin passing through the insertion area and entering the terminal-receiving area to electrically connect with the terminal. At least one receiving plane is disposed on the top surface of the cover for receiving the loading plate. The height of the receiving plane is higher than the insertion area. Two lateral protrusions are protruding respectively upwards at the two opposite sides of the cover and are outside the insertion area and parallel to the sliding route of the cover. The height of the two lateral protrusions are higher than the bottom of the loading plate.

To compare with the prior art, the improved electrical connector of the present invention has two lateral protrusions protruding respectively upwards at the two opposite sides of the cover and are outside the insertion area and parallel to the sliding route of the cover forced on the body. The height of the two lateral protrusions are higher than the bottom of the loading plate where the chip module disposed. The cover has a good strength therefore. Thus, the cover affords a better level when the pin of the chip module inserts into the through hole of the cover. The chip module is assembled on the electrical connector, and the cover is received a thrust by a driving device to move relative to the body, the two opposite sides of the cover are received the thrust along the sliding route of the cover and a resistance by the pin of the chip module opposite to the movement direction of the cover. Because the two lateral protrusions are disposed at the two opposite sides parallel of the cover's sliding route, the strength of the two opposite sides of the cover is increased. It prevents the cover deform and bend during the movement. As a result, it ensures a good electrical connection between the chip module and a printed circuit board.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF THE PREFERRED EMBODIMENTS

Please refer to FIG. 4 to FIG. 7, the present invention provide an electrical connector 1 for installing a chip module 2 and electrically connected the chip module 2 with a print circuit board. The electrical connector 1 includes a body 11, at least one terminal (not shown in the figure) disposed in the body 11, a cover 12 assembled on the body 11. A driving device (not shown in the figure) is set between the body 11 and the cover 12. The cover 12 is slidable relative to the body 11 by the driving device.

Figure 1:
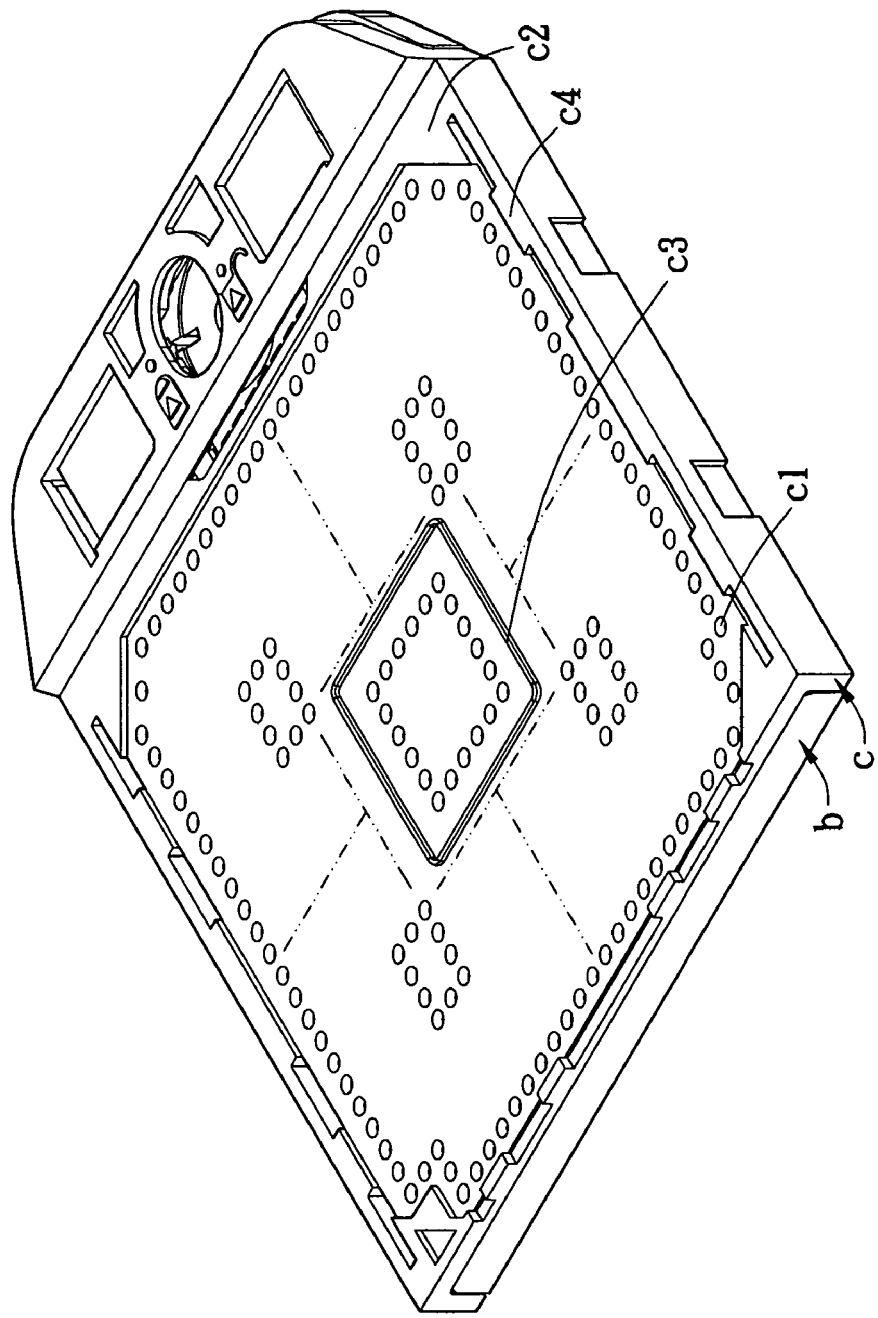
FIG. 1 is a perspective view showing the electrical connector of the prior art.
Figure 2:
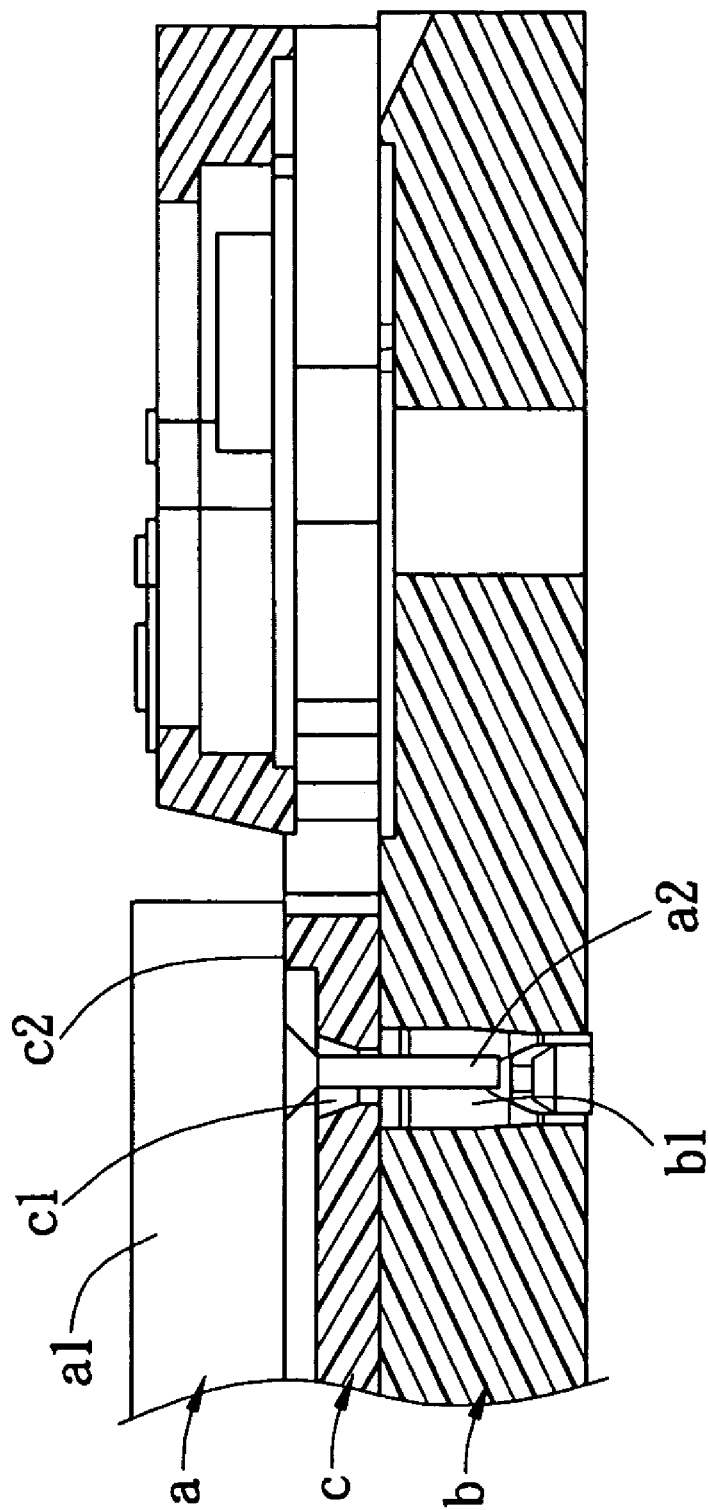
FIG. 2 is a cross-section view showing the chip module assembled on the electrical connector of the prior art.
Figure 3:
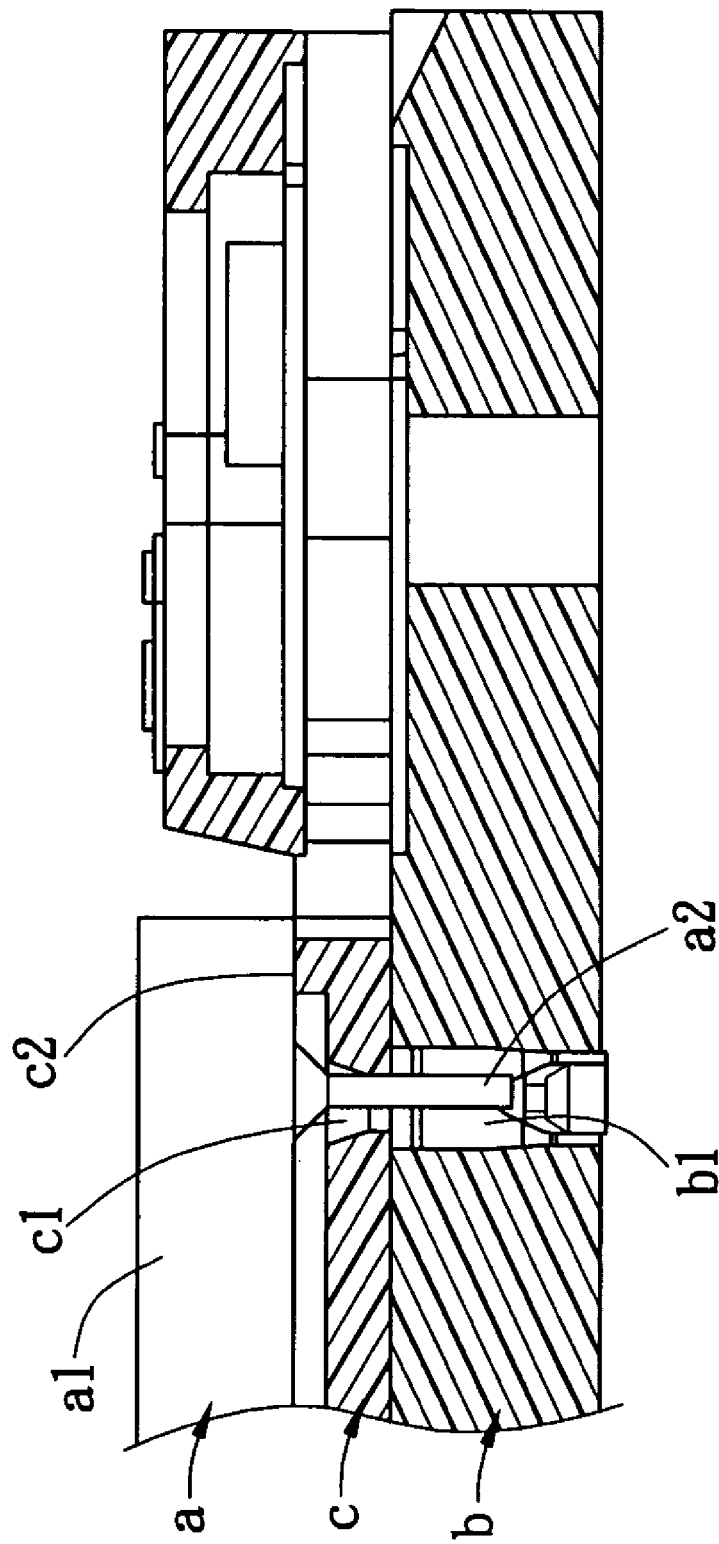
FIG. 3 is a cross-section view showing after the chip module moved relative to the electrical connector of the prior art.
Figure 4:
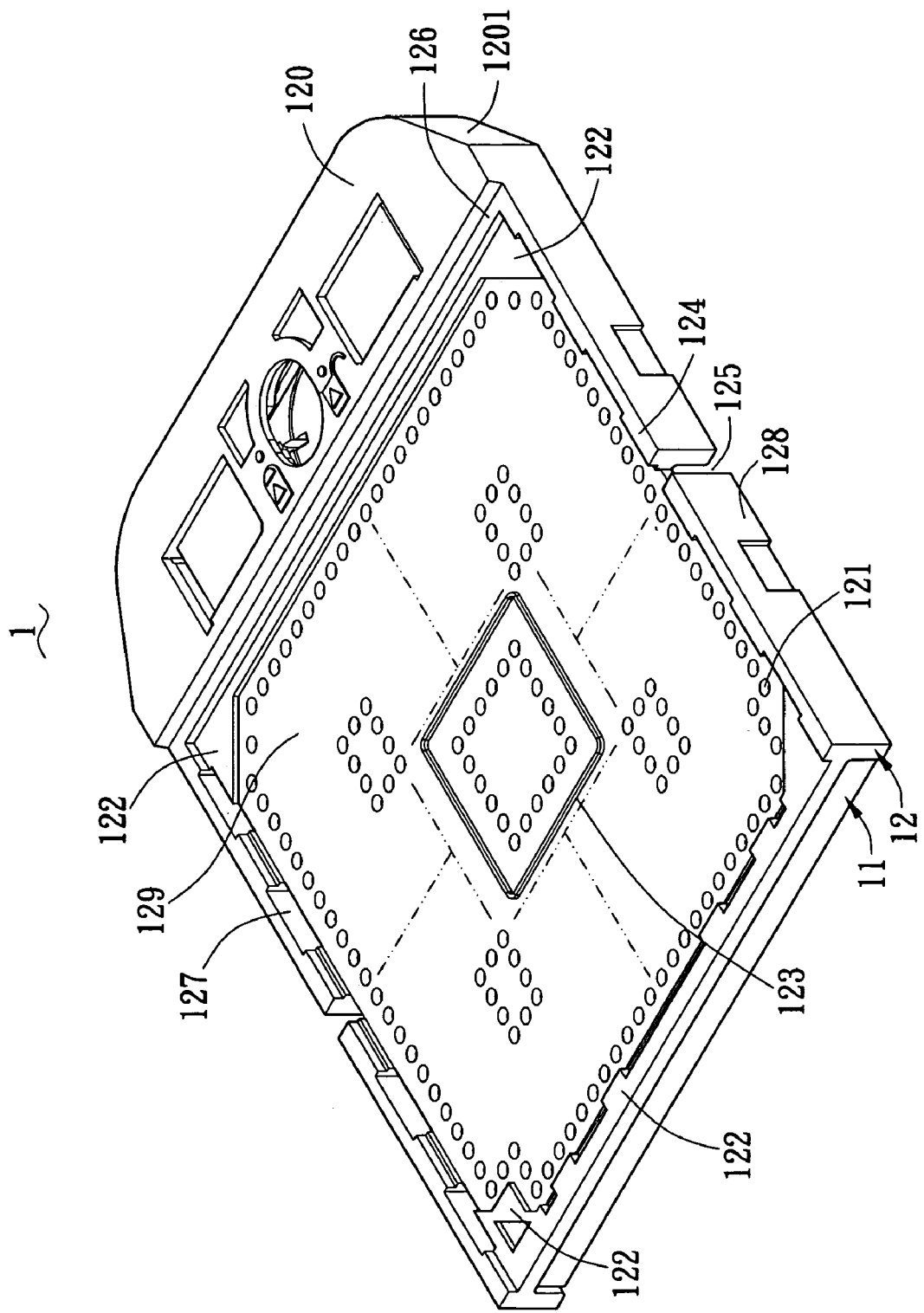
FIG. 4 is a perspective view showing the electrical connector of the present invention.
Figure 5:
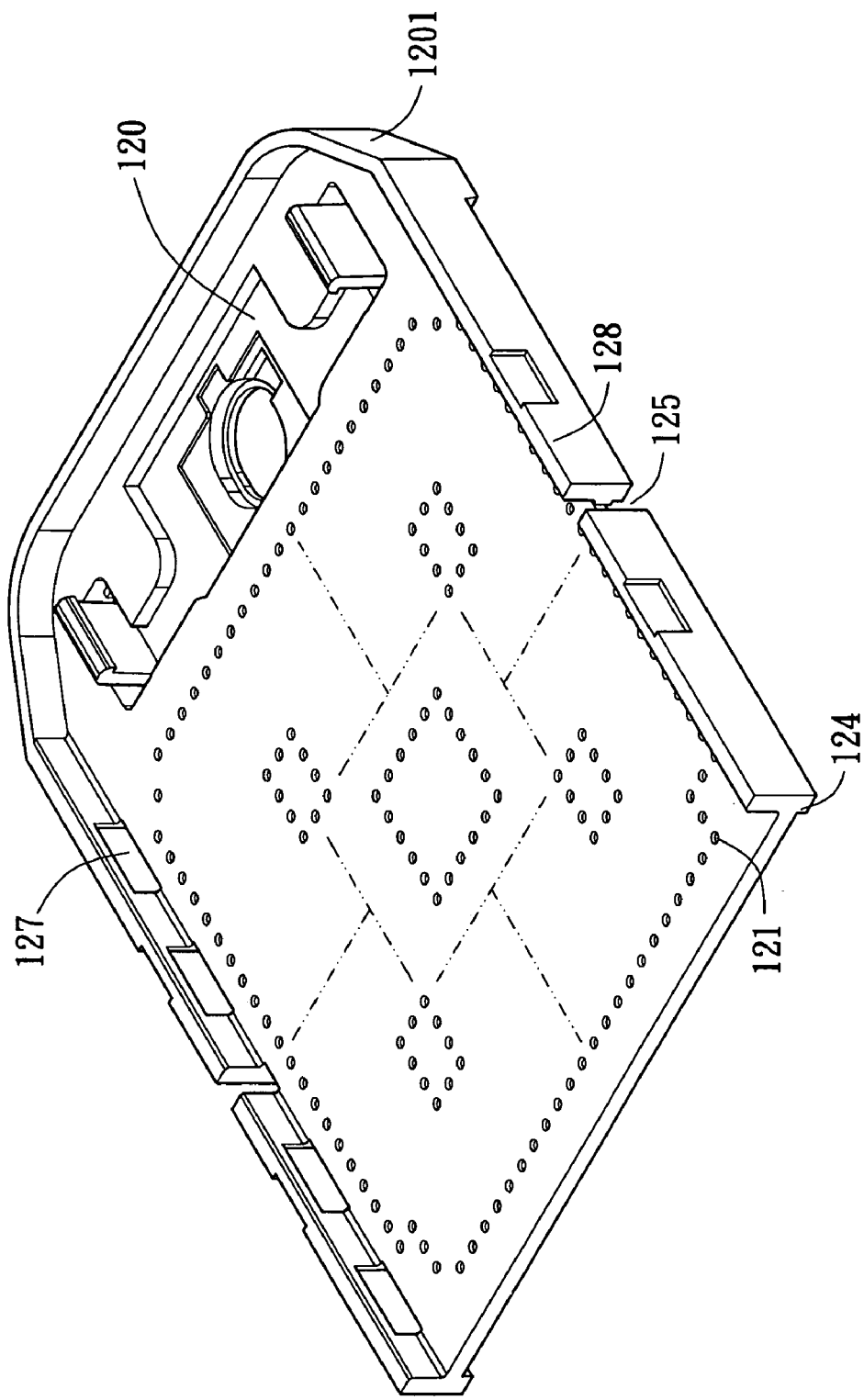
FIG. 5 is a perspective view showing the cover of the electrical connector of the present invention.
Figure 6:
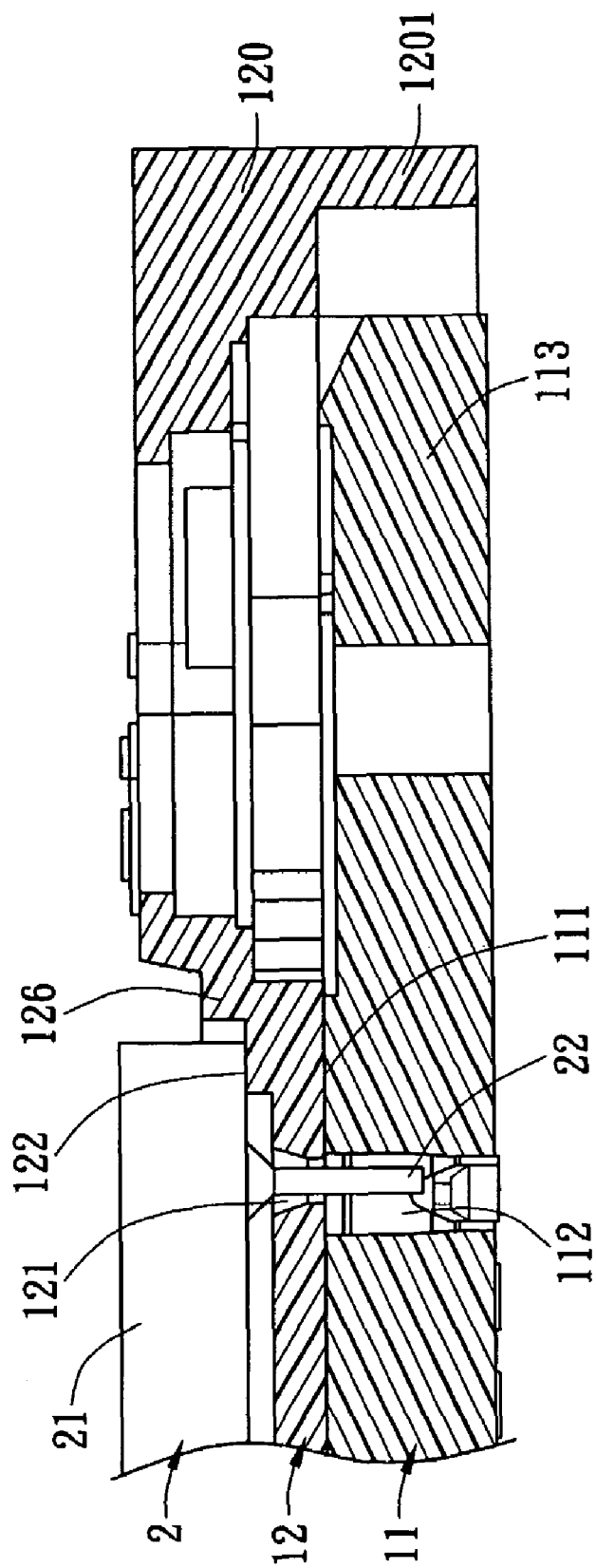
FIG. 6 is a cross-section view showing the chip module assembled on the electrical connector of the present invention.
Figure 7:
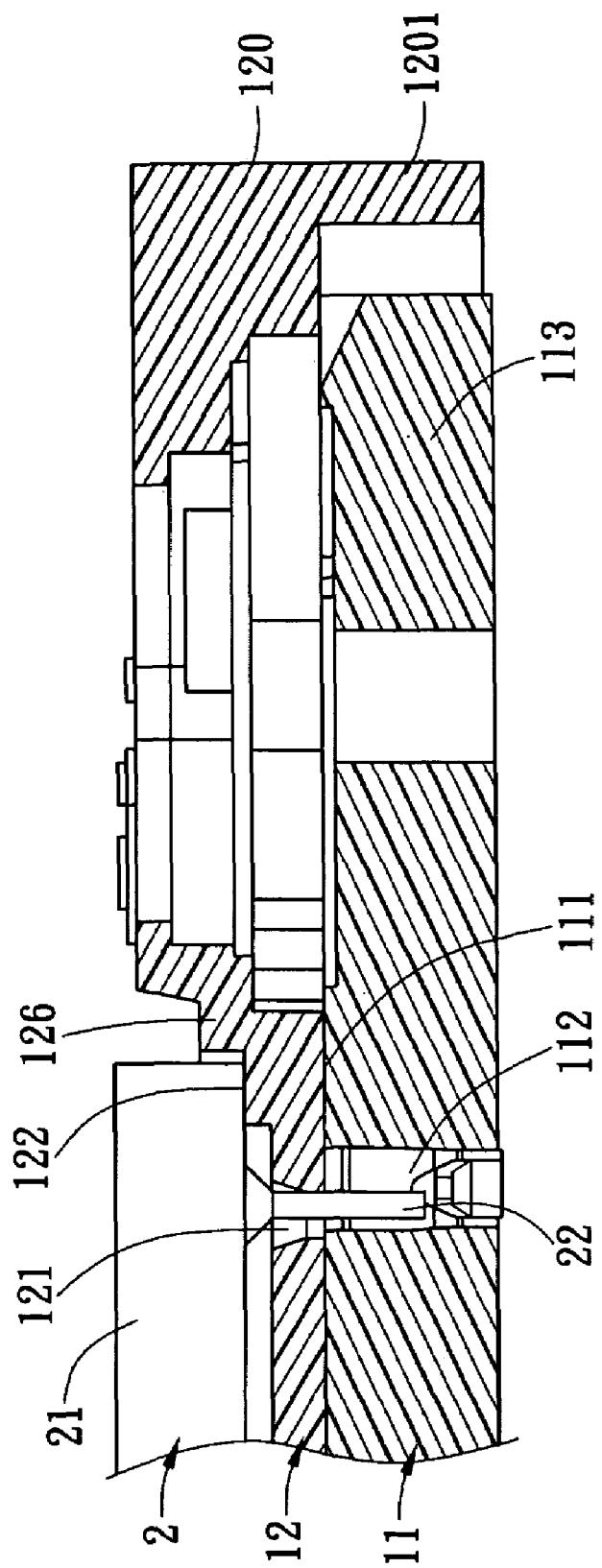
FIG. 7 is a cross-section view showing after the chip module moved relative to the electrical connector of present invention.

Please refer to FIG. 4, FIG. 6, FIG. 7, a connecting plane 111 is disposed on the body 11. The cover 12 is assembled on the connecting plane 111. A terminal-receiving area (not shown in the figure) is disposed on the connecting plane 111. The terminal-receiving area (not shown in the figure) has at least one receiving hole 112 in the body 11. Each of the terminals (not shown in the figure) is disposed in each of the receiving holes 112.

A body head 113 is extended from one side of connecting plane 111 of body 1. A part of the driving device is installed on the body head 113.

Please refer to FIG. 4 to FIG. 7, the cover 12 slides along a sliding route, covers on the body 11 and connect to the connecting plane 111 of the body 11. The cover 12 has an insertion area 129 therein and a platform 120 protruding form one side of the insertion area 129.

The insertion area 129 is disposed on the top surface of the cover 12, and the insertion area 129 has at least one through hole 121 in the cover 12. When the cover 12 moves along its sliding route to a defined position, the insertion area 129 is corresponding to the terminal-receiving area. Each of the through hole 121 is corresponding to each of the receiving hole 112.

In this embodiment, the cover 12 has a plurality of first receiving planes 122 disposed with a distance outside the insertion area 129, a plurality of the first receiving planes 122 disposed around the insertion area 129. The first receiving planes 122 for holding the chip module 2 are higher than the insertion area 129. In another embodiment, the cover 12 can have a plurality of first receiving planes 122 continuously dispose outside the insertion area 129 for holding the chip module 2.

The cover 12 has a second receiving plane 123. The second receiving plane 123 is at the center of the insertion area 129. The second receiving plane 123 for holding the chip module 2 is higher than the insertion area 129. In another embodiment, the cover 12 can have a plurality of second receiving plane 123 in the insertion area 129 for holding the chip module 2. The height of the first receiving plane 122 is equal to the second receiving plane 123.

The cover 12 at the two opposite lateral sides of the insertion area 129 has a first protrusion (lateral protrusion) 124 pointing upwards for increasing the strength of the cover 12. The two first protrusions 124 are parallel to the sliding route of the cover 12. Each of the first protrusions 124 has at least one first guiding notch 125 for dissipating the heat from the chip module 2. The first receiving planes 122 are among the two opposite first protrusions 124 and the insertion area 129. In another embodiment, the cover 12 at the two opposite sides outside the insertion area 129 can have two first protrusions 124. The two first protrusions 124 are disposed at outside of the two opposite edge of the cover 12.

The cover 12 further has a second protrusion (transverse protrusion) 126 outside the insertion area 129 for increasing the strength of the cover 12. The second protrusion 126 is near the platform 120. The two ends of the second protrusion 126 connect the two first protrusions 124 respectively. The two first protrusions 124 and the second protrusion 126 surround the insertion area 129. The second protrusion 126 also has at least one second notch (not shown in the figure).

In another embodiment, the cover 12 has two second protrusions 126 outside the insertion area 129. One of the second protrusions 126 is at the transverse side of the cover 12 near the platform 120. The other second protrusion 126 is at the opposite transverse side of the cover 12 far away the platform 120. The two ends of the two second protrusions 126 connect the two first protrusions 124 respectively. The two first protrusions 124 and the two second protrusions 126 surround the insertion area 129. Each of the two second protrusions 126 also has at least one second notch (not shown in the figure).

The cover 12 has at least one through notch 127 for dissipating the heat from the chip module 2. The through notch 127 is disposed between the first protrusion 124 and the insertion area 129. The through notch 127 is through the body 11.

The two opposite sides of the cover 12 have a lateral wall 128 protruding downwards. The two lateral wall 128 are respectively extended downward from the two first protrusions 124. The two lateral wall 128 are outside the body 11 and at the two opposite sides of the body 11 and parallel to the sliding route of the cover 12. In another embodiment, the two lateral walls 128 are extending downward from the bottom of the cover 12.

The platform 120 is corresponding to the body head 113. A part of the driving device is installed on the platform 120. The platform 120 extends downward to form a reinforcing protrusion 1201. The reinforcing protrusion 1201 connect the two lateral walls 128.

Please refer to FIG. 6 and FIG. 7, the chip module 2 has a loading plate 21. The loading plate 21 has a chip unit (not shown in the figure) and at least one pin 22 under the loading plate 21. The pin 22 is electrically connected with the chip unit.

The bottom of the loading plate 21 is lower than the first protrusions 124 and the second protrusion 126. The top of the loading plate 21 is higher than the first protrusions 124 and the second protrusion 126. Each of the pins 22 passes through the through hole 121 of the insertion area 129 and then enters into the receiving hole 112 of the terminal-receiving area to electrically connect to the terminal respectively.

When the chip module 2 is disposed on the cover 12 and connected with the electrical connector 1, the loading plate 21 is disposed on the first receiving plane 122 and the second receiving plane 123. The two first protrusions 124 and the second protrusion 126 surround the loading plate 21. The height of the two first protrusions 124 and the second protrusion 126 are higher than the bottom of the loading plate 21 but lower than the top of the loading plate 21. Thus, because the two first protrusions 124 and the second protrusion 126 surround the loading plate 21, the two first protrusions 124 and the second protrusion 126 strengthen the strength of the cover 12 even if the cover 12 is thin. It's sure that the cover 12 keeps a good level. It prevents the cover 12 deform when the pin 22 passes through the through hole 121 and receiving hole 112 to electrically connect with the terminal. It makes the pin 22 pass through the through hole 121 and receiving hole 112 to electrically connect with the terminal smoothly.

During the cover 12 is pushed by the driving device, the two opposite sides of the cover 12 are received a resistance opposite the movement direction of the cover 12 by the pin 22 of the chip module 2 and a thrust along the movement direction of the cover 12 by the driving device, because the two first protrusions 124 and the two lateral walls 128 which are disposed at the two opposite sides of the cover 12 are parallel to the sliding route and the reinforcing protrusion 1201 is at the edge of the platform 120. They strengthen the strength of the two opposite sides of the cover 12. They also make the stress does not focused on the two opposite sides of the cover 12 easily. It prevents the cover 12 deform and bend because of the resistance and the thrust. Thus, the pin 22 has a good contact with the terminal. Furthermore, it ensures the chip module 2 has a good electrical connection with the print circuit board.

When the chip module 2 is running, the center of the chip module 2 is held by the second receiving plane 123. So it prevents the center of the chip module 2 bend down and deform by the shocking of the working fan thereon. The first guiding notch 125 of the first protrusion 124 and the second guiding notch (not shown in the figure) of the second protrusion 126 can dissipate the heat from the chip module 2 to keep it work normally.

In the conclusion, the advantages of the present invention are as follows:

1. The two first protrusions are protruding upwards at the two opposite sides of the cover and outside the insertion area. The two first protrusions are parallel to the sliding route of the cover forced on the body, and the height of the two first protrusions are higher than the bottom of the loading plate where the chip module disposed. So it strengthens the strength of the cover and makes the cover has a good level when the pin of the chip module passes through the through hole of the cover.

2. When the chip module is assembled on the electrical connector, the cover is pushed by a driving device and move on the body. The two opposite sides of the cover are received a push force along the direction of its movement and a resistance of the pins of the chip module opposite to the direction of its movement. Because the two first protrusions are disposed at the two opposite sides of the cover, so it strengthens the strength of the two opposite sides of the cover. It prevents the cover deform and bend during the cover is sliding on the body. It also ensures the chip module has a good electrical connection with the printed circuit board.

3. When the chip module is running, the center of the chip module is held by the second receiving plane. It prevents the center of the chip module bend down and deform by the shocking of the working fan thereon.

4. The first guiding notch of the first protrusion and the second guiding notch of the second protrusion can dissipate the heat from the chip module to keep it work normally.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An electrical connector, used for holding a chip module, the chip module comprising a loading plate, the loading plate having a chip unit thereon and at least one pin disposed under the loading plate and electrically connected to the chip unit, the electrical connector including:
    a body having a terminal-receiving area therein;
    at least one terminal disposed in the terminal-receiving area;
    a cover sliding along a sliding route and assembled on the body, an insertion area with holes therein disposed on the top surface of the cover, the cover sliding along the sliding route to a defined position, the insertion area corresponding to the terminal-receiving area for the pin passing through the insertion area and entering the terminal-receiving area electrically connecting with the terminal;
    the cover having at least one receiving plane on the upper surface for holding the loading plate, the height of the receiving plane higher than the insertion area; and
    a lateral protrusion protruding upwards at the two opposite sides of the cover respectively and outside the insertion area, the lateral protrusion being parallel to the sliding route of the cover, the height of the lateral protrusion being higher than the bottom of the loading plate.

2. The electrical connector as claimed in claim 1, wherein the cover has at least one receiving plane outside the insertion area.

3. The electrical connector as claimed in claim 2, wherein the receiving plane is between the lateral protrusion and the insertion area.

4. The electrical connector as claimed in claim 2, wherein the receiving plane is around the insertion area.

5. The electrical connector as claimed in claim 2, wherein the cover has at least one receiving plane in the insertion area.

6. The electrical connector as claimed in claim 1, wherein the lateral protrusion has at least one guiding notch.

7. The electrical connector as claimed in claim 1, wherein the height of the lateral protrusion is lower than the top of the loading plate.

8. The electrical connector as claimed in claim 1, wherein the top surface of the cover further has at least one transverse protrusion outside the insertion area.

9. The electrical connector as claimed in claim 8, wherein the transverse protrusion is higher than the bottom of the loading plate.

10. The electrical connector as claimed in claim 9, wherein the transverse protrusion is lower than the top of the loading plate.

11. The electrical connector as claimed in claim 8, wherein the two ends of the transverse protrusion respectively connect to the lateral protrusion.

12. The electrical connector as claimed in claim 11, wherein the cover has two transverse protrusions and two lateral protrusions surrounding the insertion area.

13. The electrical connector as claimed in claim 8, wherein the transverse protrusion has at least one guiding notch.

14. The electrical connector as claimed in claim 1, wherein at least one through notch is disposed between the lateral protrusion and the insertion area, the through notch is through the body.

15. The electrical connector as claimed in claim 1, wherein the two lateral protrusions are at the two opposite edges of the cover respectively.

16. The electrical connector as claimed in claim 1, wherein the bottom of the cover has two lateral walls extended downwardly corresponding to the opposite sides of the body, the two lateral walls being parallel to the sliding route.

17. The electrical connector as claimed in claim 16, wherein the two lateral walls are at the two opposite sides of the cover.

18. The electrical connector as claimed in claim 1, wherein a platform is protruded at one side of the cover protruding.

19. The electrical connector as claimed in claim 18, wherein the platform has a reinforcing protrusion pointing downwards.

20. The electrical connector as claimed in claim 19, wherein the bottom of the cover has at least one lateral wall protruding downwards, the lateral wall connecting with the reinforcing protrusion.

21. The electrical connector as claimed in claim 1, wherein the terminal-receiving area has at least one receiving hole in the body, the terminal is disposed in the corresponding receiving hole.

22. The electrical connector as claimed in claim 21, wherein the insertion area has at least one through hole in the cover, the through hole is corresponding to the pin, and the cover slides along the sliding route to a defined position, whereby the through hole is corresponding to the receiving hole.

* * * * *